(12) United States Patent
Nakagawa et al.

(10) Patent No.: US 10,372,034 B2
(45) Date of Patent: Aug. 6, 2019

(54) IMPRINT APPARATUS, IMPRINT METHOD, AND METHOD FOR MANUFACTURING ARTICLE

(71) Applicant: CANON KABUSHIKI KAISHA, Tokyo (JP)

(72) Inventors: Kazuki Nakagawa, Utsunomiya (JP); Kazuhiro Sato, Utsunomiya (JP); Tsutomu Terao, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 362 days.

(21) Appl. No.: 15/357,740

(22) Filed: Nov. 21, 2016

(65) Prior Publication Data

US 2017/0144363 A1 May 25, 2017

(30) Foreign Application Priority Data

Nov. 24, 2015 (JP) .................................. 2015-229179
Oct. 5, 2016 (JP) .................................. 2016-197284

(51) Int. Cl.
*B29C 59/16* (2006.01)
*G03F 7/00* (2006.01)
(Continued)

(52) U.S. Cl.
CPC ............ *G03F 7/0002* (2013.01); *B29C 35/02* (2013.01); *B29C 35/0288* (2013.01); *B29C 35/08* (2013.01); *B29C 35/0805* (2013.01); *B29C 35/0888* (2013.01); *B29C 59/02* (2013.01); *B29C 59/022* (2013.01); *B29C 59/026* (2013.01);
(Continued)

(58) Field of Classification Search
CPC ....... B29C 59/02; B29C 59/022; B29C 59/16; B29C 59/026; B29C 59/023; B29C 35/02; B29C 35/0288; B29C 35/08; B29C 35/0805; B29C 35/0888; B29C 2035/0827; G03F 7/0002; G03F 7/20; G03F 7/2002;
(Continued)

(56) References Cited

U.S. PATENT DOCUMENTS

2011/0273684 A1* 11/2011 Owa ..................... B29C 43/003
355/53
2013/0093113 A1* 4/2013 Hayashi ................ G03F 7/0002
264/40.1
2016/0046045 A1* 2/2016 Matsumoto ........ G02B 27/0927
264/496

FOREIGN PATENT DOCUMENTS

JP 2013-102132 A 5/2013

* cited by examiner

*Primary Examiner* — Joseph S Del Sole
*Assistant Examiner* — Lawrence D. Hohenbrink, Jr.
(74) *Attorney, Agent, or Firm* — Canon U.S.A., Inc. I.P. Division (57) ABSTRACT

An imprint apparatus for forming a pattern of an imprint material on a substrate using a mold includes a heating unit, a generation unit, and a measurement unit. The heating unit irradiates a region to be processed on the substrate with light to heat the region to be processed. The generation unit generates irradiation amount distribution data, which indicates an irradiation amount distribution of light with which the heating unit is to irradiate the region to be processed. The measurement unit measures information about absorption of the light by the region to be processed. The generation unit generates the irradiation amount distribution data by correcting, using a result of measurement by the measurement unit, temporary irradiation amount distribution data temporarily generated based on a shape of the region to be processed taken before the region to be processed is heated by the heating unit.

11 Claims, 9 Drawing Sheets

(51) Int. Cl.
    *B29K 105/24*         (2006.01)
    *B29L 31/34*          (2006.01)
    *B29C 59/02*          (2006.01)
    *B29C 35/08*          (2006.01)
    *B29C 35/02*          (2006.01)
    *G03F 7/20*           (2006.01)

(52) U.S. Cl.
    CPC ...... *B29C 59/16* (2013.01); *B29C 2035/0827* (2013.01); *B29C 2059/023* (2013.01); *B29K 2105/24* (2013.01); *B29L 2031/34* (2013.01); *G03F 7/20* (2013.01); *G03F 7/2002* (2013.01); *G03F 7/2012* (2013.01); *G03F 7/70558* (2013.01); *G03F 7/70608* (2013.01); *G03F 2007/2067* (2013.01)

(58) Field of Classification Search
    CPC ............... G03F 7/2012; G03F 7/70608; G03F 7/70558; G03F 2007/2067
    USPC .......................................... 264/408; 425/385
    See application file for complete search history.

| REFLECTANCE A | CORRECTION COEFFICIENT $\alpha$ |
|---|---|
| A1 | $\alpha 1$ |
| A2 | $\alpha 2$ |
| A3 | $\alpha 3$ |
| . . | . . |
| An | $\alpha n$ |

IMPRINT APPARATUS, IMPRINT METHOD, AND METHOD FOR MANUFACTURING ARTICLE

BACKGROUND OF THE INVENTION

Field of the Invention

Aspects of the disclosure generally relate to an imprint apparatus, an imprint method, and a method for manufacturing an article.

Description of the Related Art

An imprint apparatus is known as an apparatus that forms a fine pattern on a substrate so as to manufacture, for example, a semiconductor device. The imprint apparatus is an apparatus that brings an imprint material supplied onto the substrate and a mold into contact with each other, applies curing energy to the imprint material, and thus forms a pattern of the cured material with a raised and recessed pattern of the mold transferred thereto.

Japanese Patent Application Laid-Open No. 2013-102132 discusses an imprint apparatus that irradiates a region to be processed, which is a region at which a base pattern of the substrate has been formed, with light to locally thermally deform the region to be processed. This reduces a difference in shape between a region at which the raised and recessed pattern of the mold is formed and the region to be processed, and is thus aimed at improving an overlay precision between the base pattern and a pattern of the cured imprint material formed on the region to be processed. In the imprint apparatus discussed in Japanese Patent Application Laid-Open No. 2013-102132, the region to be processed is irradiated with light based on irradiation amount distribution data generated based on a light absorption coefficient and a thermal expansion coefficient of the material of a previously set region to be processed and the shape of the region to be processed.

SUMMARY OF THE INVENTION

According to an aspect of the present invention, an imprint apparatus, for forming a pattern of an imprint material on a substrate using a mold, includes a heating unit configured to irradiate a region to be processed on the substrate with light to heat the region to be processed, a generation unit configured to generate irradiation amount distribution data, which indicates an irradiation amount distribution of light with which the heating unit is to irradiate the region to be processed, and a measurement unit configured to measure information about absorption of the light by the region to be processed, wherein the generation unit is configured to generate the irradiation amount distribution data by correcting, using a result of measurement by the measurement unit, temporary irradiation amount distribution data temporarily generated based on a shape of the region to be processed taken before the region to be processed is heated by the heating unit.

Further features of the present invention will become apparent from the following description of exemplary embodiments with reference to the attached drawings.

DESCRIPTION OF THE EMBODIMENTS (Apparatus Configuration)

Figure 1:
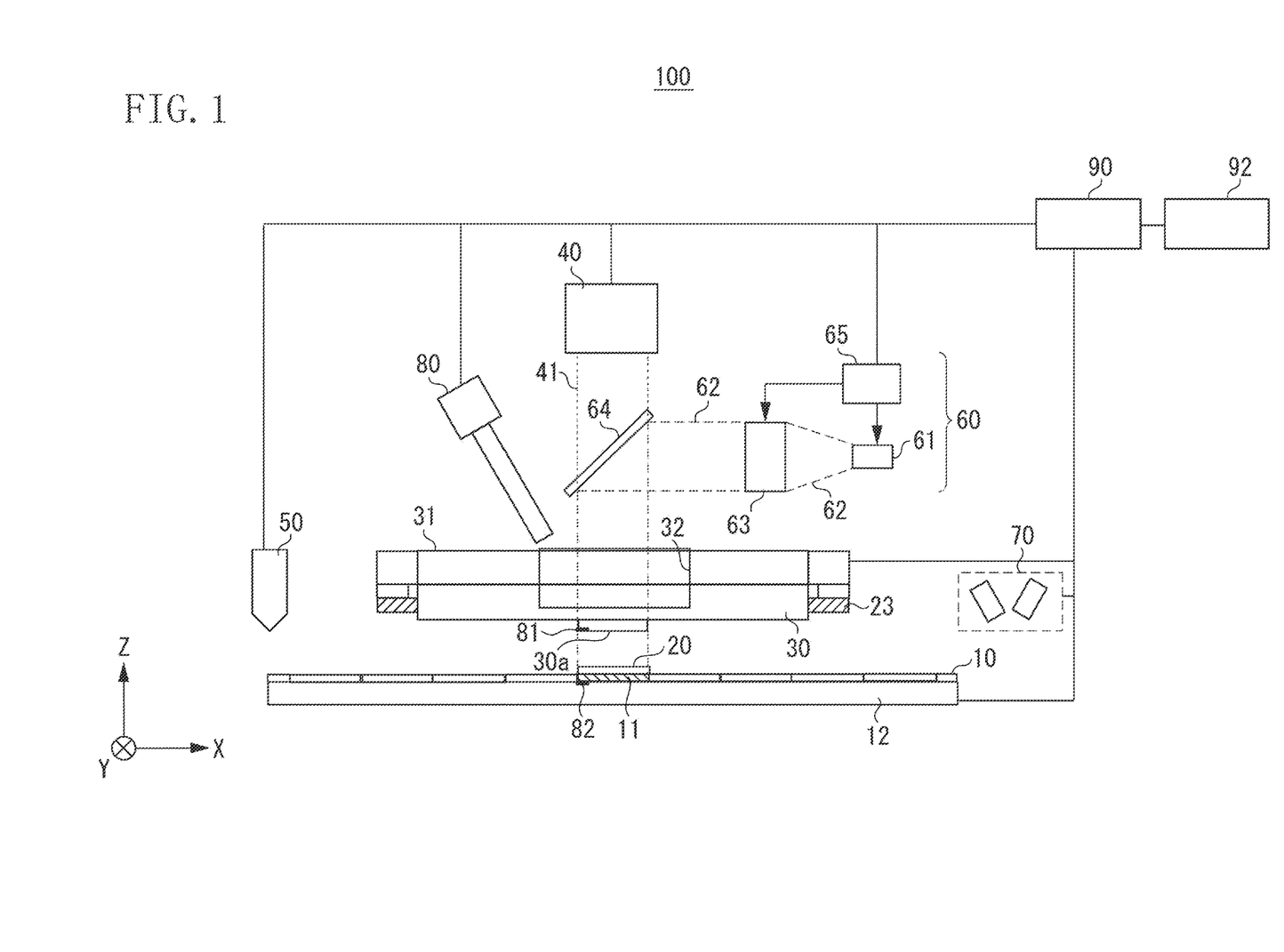
FIG. 1 illustrates a configuration of an imprint apparatus according to a first exemplary embodiment.

FIG. 1 illustrates a configuration of an imprint apparatus 100 according to first to third exemplary embodiments. In FIG. 1, the vertical direction is referred to as a "Z-axis", and two axes orthogonal to each other in a plane perpendicular to the Z-axis are referred to as an "X-axis" and a "Y-axis". The imprint apparatus 100 brings a photo-curable imprint material 20 supplied to a region to be processed 11 on a substrate 10 and a mold 30 into contact with each other and cures the imprint material 20 while keeping the imprint material 20 and the mold 30 in contact with each other, thus forming a pattern of the imprint material 20 on the region to be processed 11. The substrate 10 is made from, for example, glass, ceramic, metal, semiconductor, or resin, and a member made from a material different from that of the substrate 10 can be formed on the surface of the substrate 10 as needed. The substrate 10 is, for example, a silicon wafer, a compound semiconductor wafer, or a quartz glass plate.

The imprint apparatus 100 includes, as a forming unit that forms a pattern of the imprint material 20 on the region to be processed 11, an irradiation unit 40, a mold stage 31, a substrate stage 12, and a supply unit 50.

The irradiation unit 40 radiates ultraviolet light 41, which is used to cure the imprint material 20 that is in an uncured state, toward the substrate 10.

The mold 30 is rectangular in outer perimeter, and has, at a central portion thereof, a rectangular mold-side pattern (pattern region of the mold) 30a in which a raised and recessed pattern is formed. The mold-side pattern 30a has approximately the same size as that of the region to be processed 11. According to one set of an operation for bringing the imprint material 20 and the mold 30 into contact with each other (an imprint operation) and an operation for separating the imprint material 20 and the mold 30 from each other (a mold release operation), one transfer pattern of the mold-side pattern 30a is formed on one region to be processed 11.

In the first exemplary embodiment, the region to be processed 11 is set to the same size as that of a shot region. The shot region is a unit region of the base pattern previously formed on the substrate 10, and the size of one shot region is, for example, about 26×33 millimeters (mm). One or a plurality of chip regions having the chip size desired by the user is formed in one shot region.

In a case where the imprint material 20 is light-curable, the mold 30 is made from a material that transmits ultraviolet light 41 and light for heating (heating light) 62 emitted from a heating mechanism 60, which is described below. Examples of the material include glasses, such as quartz glass, silica-based glass, calcium fluoride, magnesium fluoride, and acrylic glass, and imprint materials, such as sapphire, gallium nitride, polycarbonate, polystyrene, acrylic, and polypropylene. Alternatively, a laminated material composed of some of these materials can be used.

The mold stage 31 moves the mold 30 along the Z-axis direction while holding the mold 30 with vacuum suction force or electrostatic force. The mold stage 31 has, at a central portion thereof, an aperture area 32 to enable the ultraviolet light 41 to reach the substrate 10. The mold stage 31 moves the mold 30 during the imprint operation and the operation for separating the imprint material 20 and the mold 30 from each other (the mold release operation).

A deformation mechanism 23 deforms the mold 30 into an intended shape by applying external force to the mold 30 in the horizontal direction. This reduces a difference in shape between the shape of the region to be processed 11 and the shape of the mold-side pattern 30a.

The substrate stage 12 moves within the X-Y plane while holding the substrate 10 with vacuum suction force or electrostatic force. For example, during formation of a pattern on the region to be processed 11, the substrate stage 12 moves the substrate 10 between a position below the supply unit 50, which is described below, and a position below the mold stage 31.

A drive mechanism (not illustrated) that moves the mold stage 31 and the substrate stage 12 can be composed of a plurality of driving systems, such as a coarse motion drive system and a micro-motion drive system. Moreover, the mold stage 31 can be provided with not only a drive mechanism for the Z-axis direction but also drive mechanisms for the X-axis direction, the Y-axis direction, and the rotational directions around the respective axes. The substrate stage 12 can be provided with not only drive mechanisms for the X-axis direction and the Y-axis direction but also drive mechanisms for the other directions and the rotational directions around the respective axes.

The imprint operation and the mold release operation can be performed by moving at least one of the mold stage 31 and the substrate stage 12 along the Z-axis direction. As the above-mentioned drive mechanisms, for example, a linear motor or a piezo actuator can be used.

The supply unit 50 supplies the imprint material that is in an uncured state onto the region to be processed 11. The supply unit 50 allows the location or amount of the imprint material 20 to be adjusted. The location or amount of the imprint material 20 is adjusted according to, for example, the density of a raised and recessed pattern formed on the mold-side pattern 30a.

The heating mechanism (heating unit) 60 irradiates the region to be processed 11 with light 62 to heat the region to be processed 11. This deforms the region to be processed 11 into a target shape. The heating mechanism 60 correcting the shape of the region to be processed 11 reduces a difference in shape between the region to be processed 11 and the mold-side pattern 30a.

The heating mechanism 60 includes a light source 61, an adjustment device 63, which adjusts the illumination distribution or a time period of irradiation of the light 62 emitted from the light source 61, and a mirror 64, which deflects the light from the adjustment device 63 toward the substrate 10. Furthermore, the heating mechanism 60 includes a light collection optical system (not illustrated), which condenses light emitted from the light source 61, and a uniform illumination optical system (not illustrated), which makes the intensity of light from the light collection optical system uniform to illuminate the adjustment device 63 with the uniform light. The uniform illumination optical system includes an optical element, such as a microlens array (not illustrated).

The light 62 has such wavelengths as not to cure the imprint material 20. For example, it is desirable that the light 62 be light having wavelengths different from the wavelengths of ultraviolet light 41 and be light existing in the wavelength band of 400 nanometers (nm) to 1200 nm.

In particular, it is desirable that the light 62 be light of a wavelength band that is hardly absorbed by the mold 30 and is easily be absorbed by the surface of the substrate 10. In a case where there is light to be used in the imprint apparatus 100 in addition to the ultraviolet light 41, it is desirable that the light 62 be light having wavelengths other than the wavelength band of such additional light. Alternatively, the light 62 can be light of a wavelength band of 200 nm to 400 nm as long as it is light of a wavelength band that hardly cures the imprint material 20.

The adjustment device 63 can be, for example, a digital micro-mirror device (DMD). The DMD includes a plurality of micro-mirrors (not illustrated) that reflect light, and is configured to allow selection of the presence or absence of irradiation with the light 62 by tilting the micro-mirrors at an angle of −12 degrees (ON state) or +12 degrees (OFF state) relative to the arrangement plane of the micro-mirrors. The size of the irradiated region with the light 62 from all of the micro-mirrors in the ON state is the same as the ideal size of the region to be processed 11.

An irradiation control unit 65, which includes a central processing unit (CPU), selectively controls selection of the ON state or the OFF state of each micro-mirror based on irradiation amount distribution data indicated by a control unit 90, which is described below.

The irradiation amount distribution data includes information about the length (timing) of a time for which to irradiate the region to be processed 11 with light from each micro-mirror in the ON state and information about the illuminance distribution within the region to be processed 11 formed at the same time.

The greater the number of micro-mirrors in the ON state or the longer the irradiation time with the light 62, the larger the irradiation amount on the region to be processed 11 becomes. In other words, the heat quantity applied to the region to be processed 11 becomes larger. Instead of adjusting the irradiation amount by changing the irradiation time, the heating mechanism 60 can change the irradiation amount by changing the intensity of the light 62.

The heating mechanism 60 applying the irradiation amount distribution causes a heat quantity distribution to be formed within one region to be processed 11. In this way, the region to be processed 11 is locally deformed into an intended shape.

The irradiation control unit 65 further controls timing of emission of the light 62. Moreover, the adjustment device 63 to be used can be a liquid crystal device capable of changing the irradiation amount distribution by individually controlling voltages to be applied to a plurality of liquid crystal elements.

The mirror 64 is also located on the optical path of the ultraviolet light 41. The mirror 64 is, for example, a dichroic mirror that transmits the ultraviolet light 41 and reflects the light 62.

In the present exemplary embodiment, a unit that acquires information about absorption of the light 62 (heating light) by the region to be processed 11 is a measurement unit 70. Moreover, the information about absorption of the light 62 is the reflectance for the light 62 of the region to be processed 11. The measurement unit receives the light 62 reflected at the region to be processed 11 to measure the reflectance of the region to be processed 11.

Figure 2:
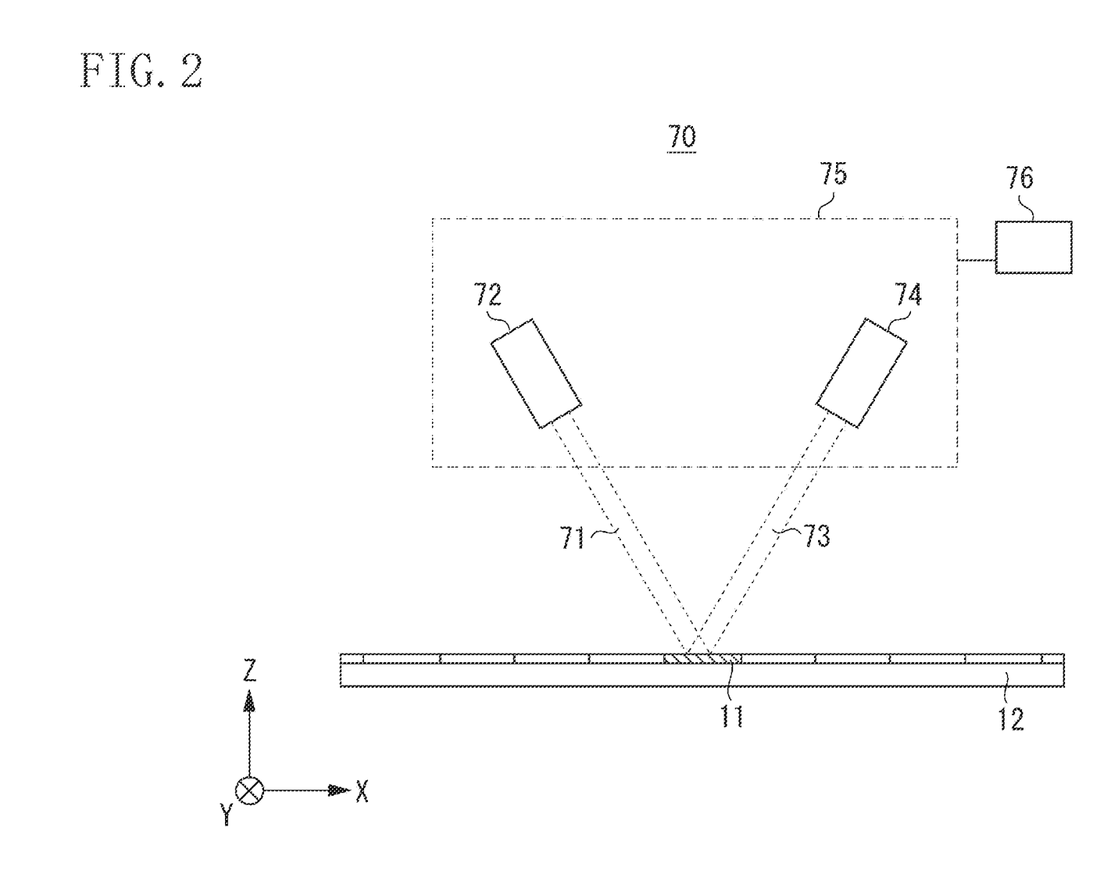
FIG. 2 illustrates a configuration of a measurement unit according to the first exemplary embodiment.

FIG. 2 illustrates a configuration of the measurement unit 70. The measurement unit 70 includes an optical system 75 including a light projection unit 72, which projects measurement light 71 onto the region to be processed 11, and a light receiving unit 74, which receives reflected light 73 reflected at the region to be processed 11. The measurement unit 70 further includes a calculation unit 76 that calculates the reflectance of the region to be processed 11 based on a result of the reflection received by the light receiving unit 74.

It is desirable that the wavelength band of the measurement light 71 used for measurement by the measurement unit 70 include at least the wavelength band of the light 62 used for heating by the heating mechanism 60. In a case where the wavelength band of the measurement light 71 is sufficiently wide as compared with the wavelength band of the light 62 (for example, in a case where white light is used), the reflectance corresponding to each wavelength included in the wavelength band of the light 62 can be calculated. In a case where the reflectance values have wavelength-dependent variances, an averaging procedure can be performed.

The calculation unit 76 calculates the reflectance of the region to be processed 11 based on the intensity ratio of the reflected light 73 to the measurement light 71. The reflectance of the region to be processed 11 measured by the measurement unit 70 is the reflectance of a material layer constituting the surface side of the region to be processed 11. The reflectance calculated by the calculation unit 76 is stored into a storage unit 92 by the control unit 90.

An observation unit 80 observes a mark 81 formed on the mold-side pattern 30a and a mark 82 formed on the region to be processed 11. The mark 81 is mounted at each of at least four corners of the mold-side pattern 30a, and the mark 82 is mounted at each of at least four corners of the region to be processed 11. The control unit 90, which is described below, detects a shape difference between the mold-side pattern 30a and the region to be processed 11 or detects the relative positional deviation of the region to be processed 11 from the mold-side pattern 30a, based on a result of observation by the observation unit 80.

The control unit 90, which includes a CPU, a random access memory (RAM), and a read-only memory (ROM), comprehensively controls the substrate stage 12, the mold stage 31, the irradiation unit 40, the supply unit 50, the irradiation control unit 65, the measurement unit 70, the observation unit 80, and the storage unit 92, which are connected to the control unit 90. The control unit 90 has a function to perform imprint processing according to a program illustrated in the flowchart of FIG. 4, which is described below.

The control unit 90 detects a shape difference between the mold-side pattern 30a and the region to be processed 11 based on a result of the observation of the marks 81 and 82 by the observation unit 80. Moreover, the control unit 90 calculates a shape correction amount for the mold-side pattern 30a and a shape correction amount for the region to be processed 11 based on the shape difference between the mold-side pattern 30a and the region to be processed 11.

Furthermore, the control unit 90 has a function serving as a generation unit, and thus generates irradiation amount distribution data, which indicates an irradiation amount distribution of the light 62 with which the heating mechanism 60 irradiates the region to be processed 11. At this time, the control unit 90 generates the irradiation amount distribution data by correcting, using a result of measurement by the measurement unit 70, temporary irradiation amount distribution data temporarily generated based on a shape of the region to be processed 11 taken before the region to be processed 11 is heated by the heating mechanism 60.

The temporary irradiation amount distribution data is data theoretically calculated based on, for example, the shape of the region to be processed 11, a predicted absorption factor for the light 62 set in the design, and a thermal expansion coefficient of the region to be processed 11. The method for generating the irradiation amount distribution data is described in detail below. The control unit 90 determines a correction coefficient (correction value) required for correction based on a result of measurement by the measurement unit 70.

The irradiation amount distribution data generated by the control unit 90 is irradiation amount distribution data used to reduce a shape difference between the mold-side pattern 30a and the region to be processed 11.

Figure 3:
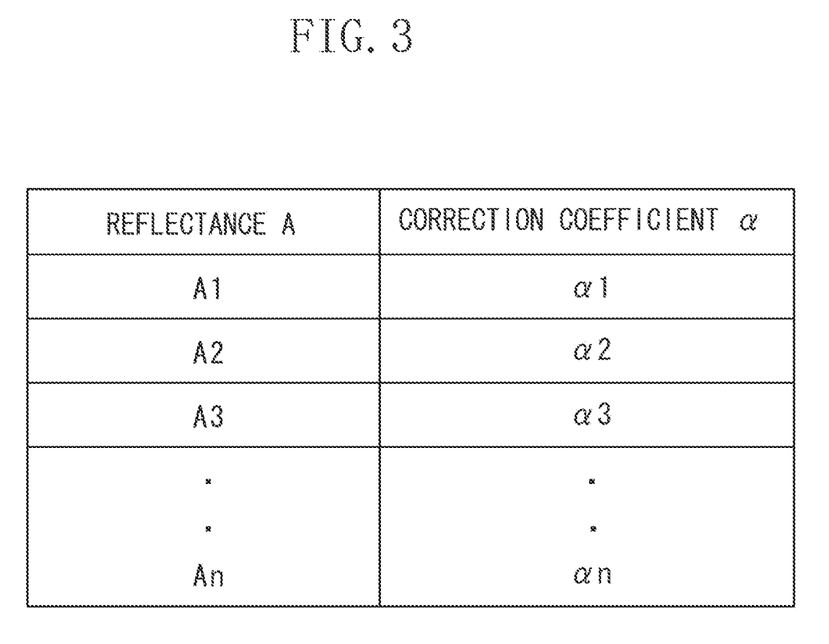
FIG. 3 illustrates a relationship between reflectance information and correction coefficients.

The storage unit 92 is composed of, for example, a hard disk (a storage medium) that is readable by the control unit 90. The storage unit 92 stores reflectances (A1, A2, ..., An), each of which may represent a ratio of a total amount of radiation, as of light, reflected by a surface to a total amount of radiation incident on the surface, and correction coefficients ($\alpha 1, \alpha 2, \ldots, \alpha n$), such as those illustrated in FIG. 3, while respectively associating those with each other.

Since the light that has not been absorbed by the region to be processed 11 is reflected, the reflectance and the absorption factor are correlated with each other. Therefore, the correction coefficient is set to the ratio I/I' of the absorption factor I for the light 62 of the region to be processed 11 used for generation of the temporary irradiation amount distribution data to the absorption factor I' for the light (heating light) 62 of the region to be processed 11 determined based on the reflectance measured by the measurement unit 70. Alternatively, the correction coefficient can be a difference between the absorption factor for the light 62 previously stored in the storage unit 92 as a design value and the absorption factor calculated and obtained by the control unit 90 from the reflectance measured by using the measurement unit 70. Instead of a correspondence table (a table) such as that illustrated in FIG. 3, a function representing the relationship between the reflectance and the correction coefficient can be stored.

Figure 4:
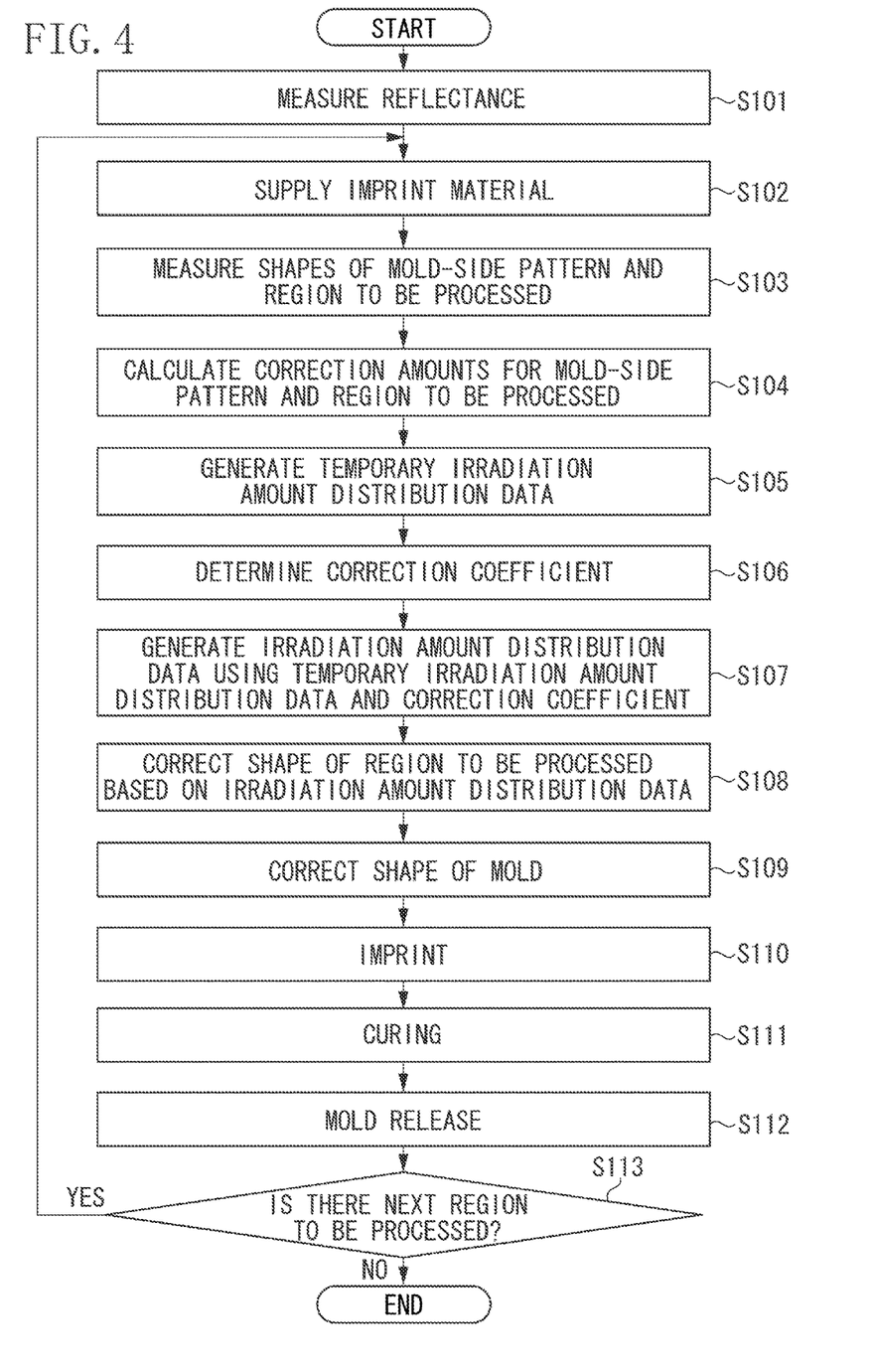
FIG. 4 is a flowchart illustrating an imprint method according to the first exemplary embodiment.

Furthermore, the storage unit 92 stores a program illustrated in the flowchart of FIG. 4.

(Imprint Method)

FIG. 4 is a flowchart illustrating an imprint method according to the present exemplary embodiment. Constituent members connected to the control unit 90 perform the following operations based on instructions from the control unit 90. In the present exemplary embodiment, a reflectance measured at one location is assumed to be also the same reflectance as that measured within a region to be processed 11 including the measured location and that measured within another region to be processed 11 on the same substrate as the substrate 10 on which the measured region to be processed 11 is located.

In step S101, the measurement unit 70 measures the reflectance of the region to be processed 11 in the state in which the region to be processed 11 is positioned below the measurement unit 70. The control unit 90 stores the reflectance obtained by the measurement into the storage unit 92.

In step S102, the supply unit 50 supplies the imprint material 20 onto the region to be processed 11. The region to be processed 11 is positioned below the mold 30 by the substrate stage 12. Then, in step S103, the control unit 90 obtains a shape difference between the mold-side pattern 30a and the region to be processed 11 based on a result of observation of the mark 81 and the mark 82 by the observation unit 80. Moreover, the shape difference between the mold-side pattern 30a and the region to be processed 11 can be the one obtained in advance by the outside of the imprint apparatus 100. For example, the shape difference can be a difference between the shape of the region to be processed 11 measured by the outside and the shape of the mold-side pattern 30a obtained based on the design value of the mold-side pattern 30a.

In step S104, the control unit 90 calculates a shape correction amount that is used for the mold-side pattern 30a by the deformation mechanism 23 and a shape correction amount that is used for the region to be processed 11 by the heating mechanism 60 based on the shape difference between the mold-side pattern 30a and the region to be processed 11. At this time, the control unit 90 calculates the respective shape correction amounts in such a manner that the corrected shape of the mold-side pattern 30a and the corrected shape of the region to be processed 11 coincide with each other or a shape difference between the corrected shape of the mold-side pattern 30a and the corrected shape of the region to be processed 11 decreases. When the deformation mechanism 23 applies external force to the mold-side pattern 30a, while the mold 30 deforms in a direction in which the force is applied, stress occurs in a direction perpendicular to the direction in which the force is applied according to the Poisson's ratio. It is desirable that the shape correction amount for the region to be processed 11 be determined also in consideration of the deformation of the mold-side pattern 30a occurring according to the Poisson's ratio. In this case, a high-order component of the shape difference between the mold-side pattern 30a and the region to be processed 11 can be reduced as compared with a case where the shape correction is performed by only the deformation mechanism 23.

In step S105, the control unit 90 generates temporary irradiation amount distribution data $F(x, y, t)$, which indicates heat amounts to be applied by the heating mechanism 60, using the shape correction amount for the region to be processed 11 calculated in step S104 and information about, for example, the absorption factor and the thermal expansion coefficient of the material of the region to be processed 11.

In step S106, the control unit 90 reads out the reflectance stored in the storage unit 92, and determines a correction coefficient used for correction of the temporary irradiation amount distribution data while referring to the relationship between the reflectance and the correction coefficient. The determination of the correction coefficient can be performed at any timing as long as it is at any of step S101 and subsequent steps and before step S106.

In step S107, the control unit 90 generates irradiation amount distribution data $F'(x, y, t)$ by performing arithmetic processing including a calculation for multiplying the temporary irradiation amount distribution data $F(x, y, t)$ by the correction coefficient a determined in step S106. For example, the control unit 90 generates the irradiation amount distribution data $F'(x, y, t)$ by calculating "$F'=\alpha \times F$". The control unit 90 can perform other arithmetic processing, such as subtraction of a predetermined number as an offset or multiplication by a predetermined number, before or after performing the calculation for multiplying the temporary irradiation amount distribution data $F(x, y, t)$ by the correction coefficient.

In step S108, the heating mechanism 60 heats the region to be processed 11 based on the irradiation amount distribution data obtained as a result of correction in step S107. This causes the region to be processed 11 to stretch in a predetermined direction, so that the shape of the region to be processed 11 is corrected. Moreover, even in a case where light is absorbed at only the surface side of the region to be processed 11, since heat generated at that location is also transferred to the substrate 10, as a result, the region to be processed 11 stretches together with the substrate 10.

In step S109, the deformation mechanism 23 applies external force to the mold 30 based on the shape correction amount for the mold 30 obtained in step S104. This causes the shape of the mold-side pattern 30a to be corrected into an intended shape. The process in steps S108 and S109 reduces a difference between the shape of the mold-side pattern 30a and the shape of the region to be processed 11 as compared with that in step S103. Moreover, any of steps S108 and S109 can be performed earlier.

In step S110, the mold stage 31 causes the mold 30 to descend, thus bring the mold 30 into contact with the imprint material 20, as an imprint operation. The imprint operation in step S110 can be performed before at least one of steps S108 and S109. The recessed portions of the mold-side pattern 30a are filled with the imprint material 20.

In step S111, the heating mechanism 60 irradiates the region to be processed 11 with the light 62 based on the irradiation amount distribution data to thermally deform the region to be processed 11, and the irradiation unit 40 irradiates the imprint material 20 with the ultraviolet light 41 while keeping the imprint material 20 and the mold 30 in contact with each other. This causes the imprint material 20 to be subjected to curing. In step S112, after completion of curing, the mold stage 31 causes the mold 30 to ascend, thus separating the mold 30 from the imprint material 20, as a mold release operation. This causes a pattern of the imprint material 20 having a three-dimensional shape corresponding to the raised and recessed portions of the mold-side pattern 30a to be formed on the region to be processed 11.

In step S113, the control unit 90 determines whether there is a next region to be processed 11 on which a pattern is to be formed, and, when determining that there is no next region to be processed 11 (NO in step S113), ends the present program and performs processing for discharging the substrate 10. When, in step S113, determining that there is a next region to be processed 11 (YES in step S113), the control unit 90 repeats steps S102 to S113. The control unit 90 uses the reflectance measured in step S101 as the reflectance of the new region to be processed 11.

The above-described imprint processing can be performed on only a substrate to be first processed among substrates of the same lot. In this case, the imprint processing is performed on subsequent substrates 10 of the same lot while omitting a measurement process for the reflectance in step S101. The measurement unit 70 can measure the reflectance each time a new material layer is stacked.

In this way, the control unit 90 generates the irradiation amount distribution data, which is used by the heating mechanism 60 to heat the region to be processed 11, by correcting the temporary irradiation amount distribution data based on a result of measurement by the measurement unit 70. Even in a case where the absorption factor for the light 62 of the region to be processed 11 assumed at the time of calculation of the temporary irradiation amount distribution data and the actual absorption factor for the light 62 are different from each other, the control unit 90 is able to correct an influence of an error in absorption factor regardless of a combination of materials of a base pattern of the substrate 10 or a pattern density. This enables precisely correcting the shape of the region to be processed 11 and forming a pattern by imprint processing with a high overlay precision.

In a second exemplary embodiment, a unit that acquires information about the absorption of the light 62 by the region to be processed 11 is the measurement unit 70. Moreover, the information about the absorption of the light 62 is the reflectance for the light 62 of the region to be processed 11.

The reflectance varies with the density of a circuit pattern formed in the region to be processed 11. For example, the reflectance may be large at a location where the pattern density is large, and the reflectance may be small at a location where the pattern density is small. In the second exemplary embodiment, the measurement unit 70 receives reflected light beams 73 (FIG. 2) reflected at a plurality of locations in one chip region 95 (FIG. 5), thus measuring the reflectance at each of the plurality of locations. The control unit 90, serving as a generation unit, generates irradiation amount distribution data by correcting temporary irradiation amount distribution data based on a result of measurement at each region to be processed 11 by the measurement unit 70.

Figure 5:
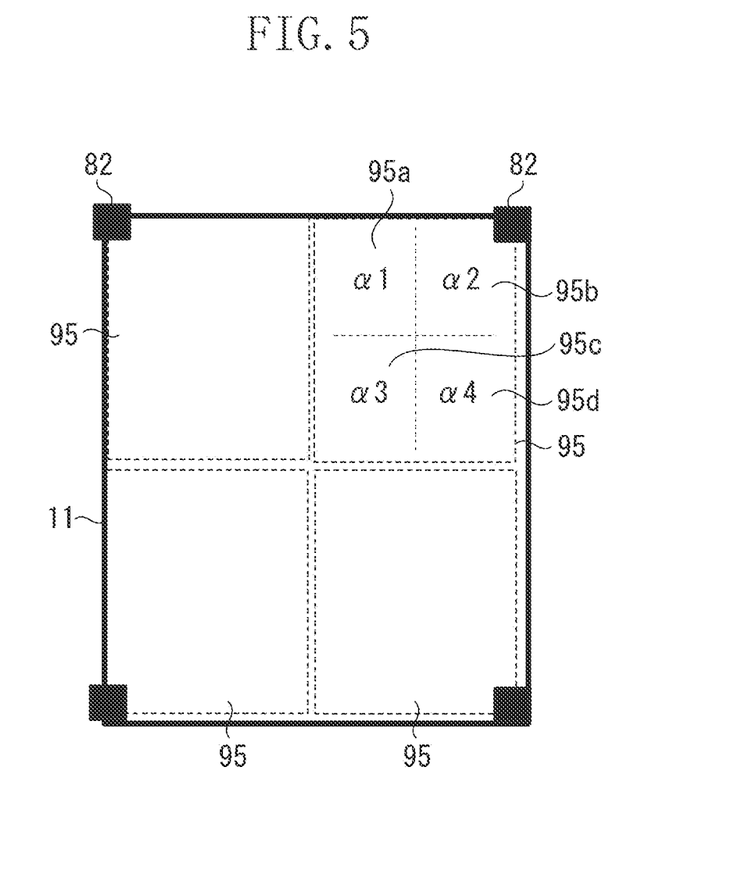
FIG. 5 is a diagram used to illustrate a heat quantity distribution used in a second exemplary embodiment.

FIG. 5 illustrates one region to be processed 11 and four chip regions (a plurality of chip regions) 95 included in the region to be processed 11.

The imprint method in the second exemplary embodiment is almost similar to that in the first exemplary embodiment. In step S101 in the flowchart of FIG. 4, the measurement unit 70 measures respective reflectances at a plurality of locations in at least one chip region 95. For example, the measurement unit 70 measures respective reflectances at regions 95a, 95b, 95c, and 95d, which are divisional regions obtained by virtually dividing one chip region 95.

The control unit 90 calculates a total of four correction coefficients α1, α2, α3, and α4 corresponding to the respective regions 95a, 95b, 95c, and 95d based on a result of measurement by the measurement unit 70. The control unit 90 corrects the temporary irradiation amount distribution data at the respective regions 95a, 95b, 95c, and 95d using the correction coefficients α1, α2, α3, and α4.

In this way, the control unit 90 generates the irradiation amount distribution data, which is used by the heating mechanism 60 to heat the region to be processed 11, by correcting the temporary irradiation amount distribution data based on a result of measurement by the measurement unit 70. This enables precisely correcting the shape of the region to be processed 11 as with the first exemplary embodiment. Moreover, since the irradiation amount distribution data is generated using information about the reflectance that varies with a difference in pattern density in the chip region 95, the overlay precision can be more improved than in the first exemplary embodiment.

The reflectance can be measured at a more number of locations in the chip region 95 to obtain a distribution function of the reflectance, and the irradiation amount distribution can be determined based on the distribution function of the reflectance.

In a third exemplary embodiment, a unit that acquires information about the absorption of the light 62 by the region to be processed 11 is the measurement unit 70. Moreover, the information about the absorption of the light 62 is the reflectance for the light 62 of the region to be processed 11.

Even in the surface of the same substrate 10, the surface condition of the region to be processed 11 varies by regions to be processed 11, so that the light absorption factor would vary. In the third exemplary embodiment, in consideration of the variation of the absorption factor of the surface of the same substrate 10, the measurement unit 70 receives respective reflected light beams reflected at a plurality of regions to be processed 11, thus measuring respective reflectances at the plurality of regions to be processed 11. The control unit 90 generates irradiation amount distribution data based on results of measurement by the measurement unit 70 at the respective regions to be processed 11.

In other words, the control unit 90 determines correction coefficients corresponding to the respective regions to be processed 11 at which the reflectances have been measured and corrects the temporary irradiation amount distribution data using the determined correction coefficients, thus generating irradiation amount distribution data for the respective regions to be processed 11.

In step S101, the measurement unit 70 can measure reflectances at only a plurality of representative regions to be processed 11 on the substrate 10. The control unit 90 can perform calculation for supplementing reflectances at the other locations in the surface of the substrate 10 based on results of measurement of reflectances at the representative regions to be processed 11, and then can calculate a reflectance distribution in the surface of the substrate 10, thus calculating reflectances at other than the measurement points. This enables shortening the measurement time and a time for reciprocal motion of the substrate stage 12 between the imprint position below the mold 30 and the measurement position for measurement by the measurement unit 70 as compared with the case of measuring reflectances of all of the regions to be processed 11.

In this way, the control unit 90 generates the irradiation amount distribution data, which is used by the heating mechanism 60 to heat the region to be processed 11, by correcting the temporary irradiation amount distribution data based on a result of measurement by the measurement unit 70. This enables precisely correcting the shape of the region to be processed 11 as with the first exemplary embodiment. Moreover, even in a case where the light absorption factor differs with a plurality of regions to be processed 11, the respective shapes of the plurality of regions to be processed 11 can be precisely corrected.

Figure 6:
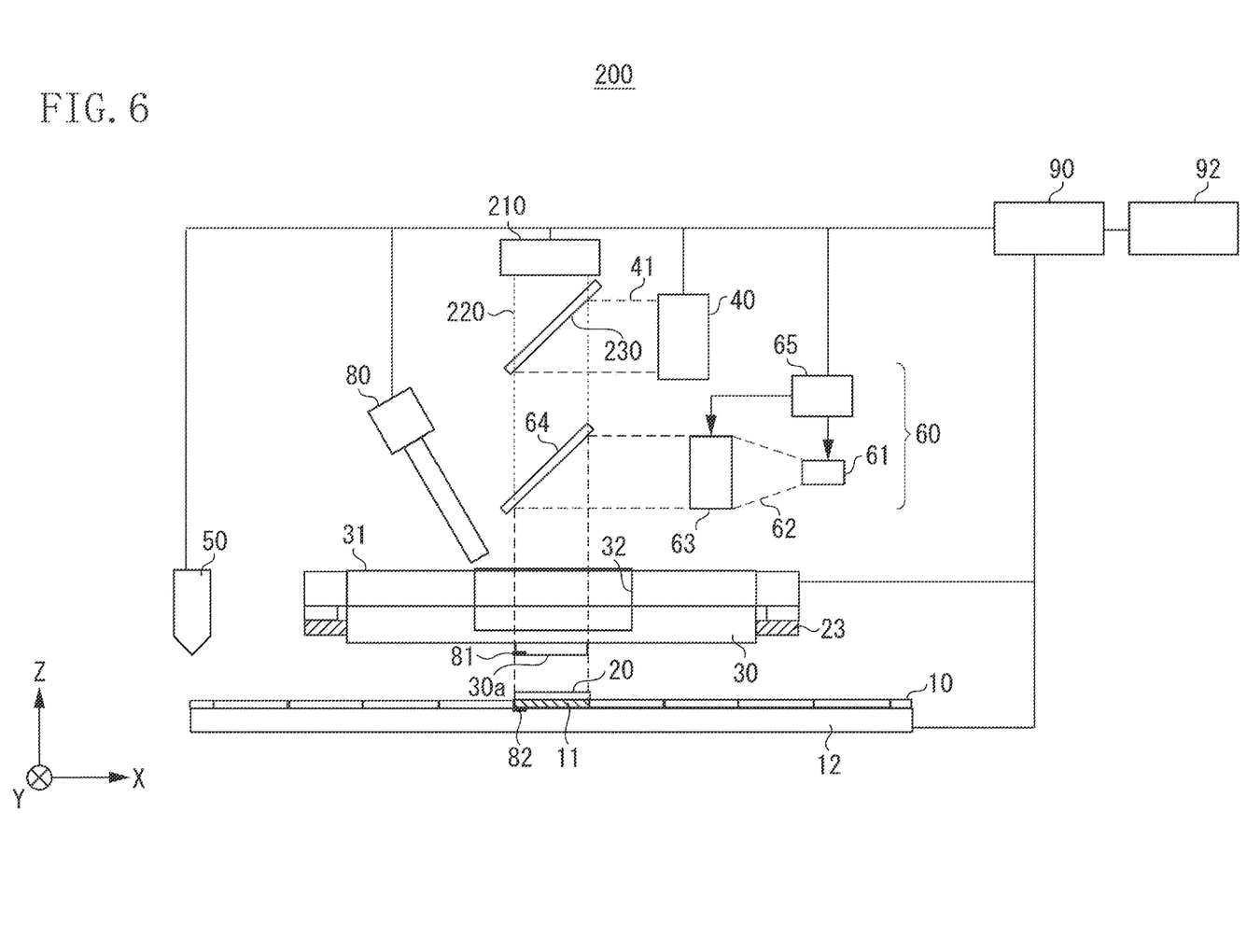
FIG. 6 illustrates a configuration of an imprint apparatus according to a fourth exemplary embodiment.

FIG. 6 illustrates a configuration of an imprint apparatus 200 according to a fourth exemplary embodiment, and a unit that acquires information about the absorption of the light 62 by the region to be processed 11 is a spread camera 210. Moreover, the information about the absorption of the light 62 is the reflectance for the light 62 of the region to be processed 11.

The spread camera 210 is a camera used to observe a contact state between the imprint material 20, which is supplied to the region to be processed 11 on the substrate 10, and the mold 30. Observing a contact state between the mold 30 and the substrate 10 via the imprint material 20 enables specifying a defective portion caused by tucking of particles or incomplete filling. The spread camera 210 includes a light source, an image sensor, an optical system, and a processing unit, all of which are not illustrated. As the light source of the spread camera 210, for example, a light-emitting diode (LED) that emits light 220 having such wavelengths as not to cure the imprint material 20 is used, and as the image sensor, a two-dimensional sensor, such as a charge-coupled device (CCD) sensor, is used. The optical system includes an illumination optical system that uniformly illuminates a region including the region to be processed 11 of the substrate 10 with the light 220 from the light source, and an imaging optical system that makes the substrate 10 and the image sensor optically conjugate with each other. The light 220 emitted from the light source passes through a mirror 230 and a mirror 64, which are arranged on the optical path of the ultraviolet light 41, passes through the mold 30, and illuminates the region to be processed 11. The wavelength band of the light 220 contains the wavelengths of the light 62.

The processing unit of the spread camera 210 processes an image obtained by the image sensor to calculate the reflectance of the region to be processed 11 with respect to the light 220. Moreover, the processing unit processes an image obtained by the image sensor to detect defects including tucking of particles between the imprint material 20 and the mold-side pattern 30*a* and incomplete filling of the imprint material 20 into the mold-side pattern 30*a*.

The mirror 230 reflects the ultraviolet light 41 toward the region to be processed 11, and transmits the light 220. As the mirror 230, for example, a dichroic mirror is used.

In the imprint apparatus 200, the same members as those of the imprint apparatus 100 are assigned the respective same reference numerals. The detailed description of constituent members similar to those of the imprint apparatus 100 is omitted.

Figure 7:
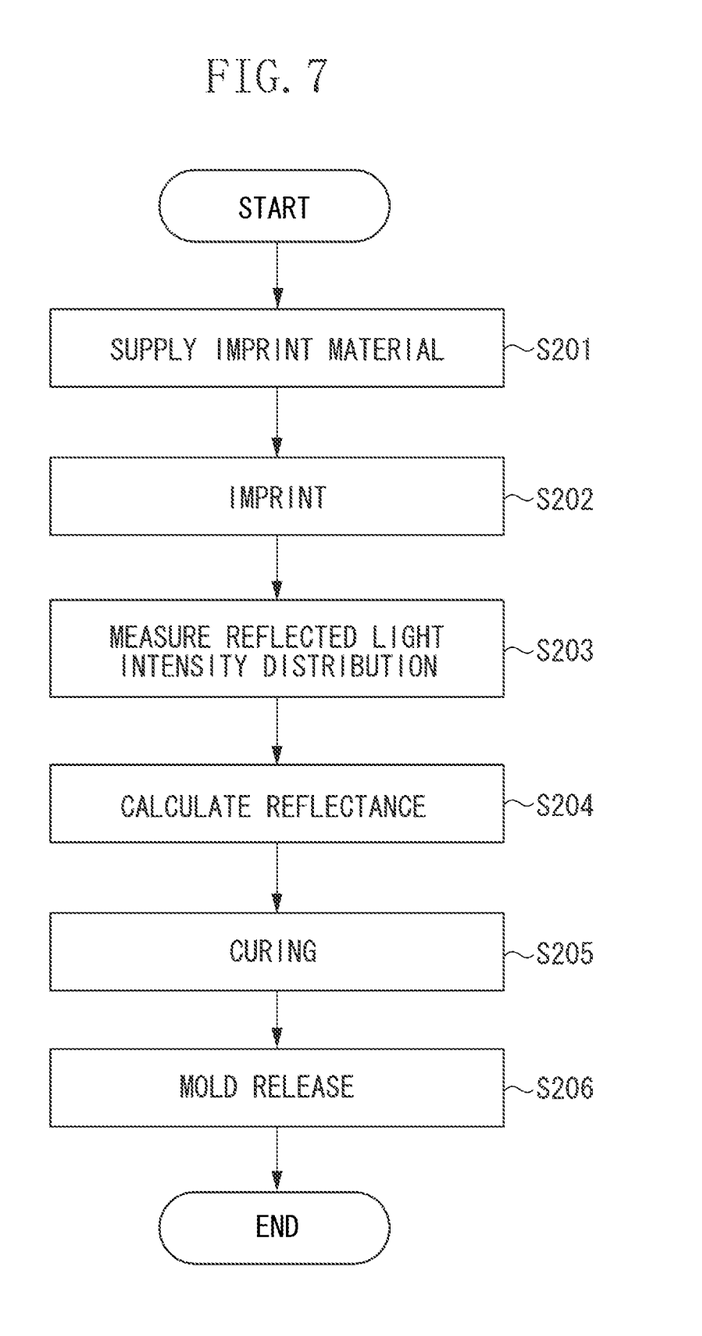
FIG. 7 is a flowchart illustrating a measurement method according to the fourth exemplary embodiment.

An imprint method according to the fourth exemplary embodiment differs from that of the first exemplary embodiment in a method for measuring the reflectance and a method for determining a correction coefficient. A process that is performed instead of step S101 illustrated in FIG. 4 is described with reference to the flowchart of FIG. 7 illustrating the method for measuring the reflectance. The control unit 90 causes the constituent members to perform the following operations according to a program illustrated in the flowchart of FIG. 7.

Furthermore, a reflected light intensity distribution of a bare wafer (a substrate with no material layer formed, or a substrate for calibration) having a known reflectance, previously measured by the spread camera 210, is stored in the storage unit 92 for the purpose of calibration. The reflected light intensity distribution for calibration is an intensity distribution obtained by the image sensor of the spread camera 210 receiving reflected light from the region to be processed 11 illuminated with the light 62 in a uniform illuminance distribution.

First, in step S201, the supply unit 50 supplies the imprint material 20 onto the region to be processed 11. In step S202, the mold stage 31 causes the mold 30 to descend, thus bring the mold 30 into contact with the imprint material 20, as an imprint operation.

In step S203, the control unit 90 controls the heating mechanism 60 to irradiate the region to be processed 11 with the light 62 in a uniform illuminance distribution, and causes the spread camera 210 to measure a reflected light intensity distribution obtained from the region to be processed 11. In step S204, the control unit converts the reflected light intensity distribution obtained in step S203 into the reflectance based on the reflected light intensity distribution for calibration stored in the storage unit 92 and the known reflectance, and stores the reflectance calculated based on the actually measured value into the storage unit 92.

In step S205, the irradiation unit 40 irradiates the region to be processed 11 with the ultraviolet light 41 to cure the imprint material 20. In step S206, after completion of curing, the mold stage 31 causes the mold 30 to ascend, thus performing a mold release operation. With that, the program illustrated in the flowchart of FIG. 7 ends.

With the use of the reflectance obtained by the above program, the above-described steps S102 to S113 are performed with respect to regions to be processed 11 other than the region to be processed 11 used in steps S201 to S206. In other words, the control unit 90 determines irradiation amount distribution data used to thermally deform the region to be processed 11, by correcting temporary irradiation amount distribution data with a correction coefficient obtained from the reflectance, which is information about absorption of light by the region to be processed 11 measured by the spread camera 210.

This enables the imprint processing in steps S102 to S113 to precisely correcting the shape of the region to be processed 11 regardless of a material layer stacked on the substrate 10 or a pattern previously formed on the material layer. This also enables improving the overlay precision in the region to be processed 11 on which a pattern is formed in steps S102 to S113. Moreover, measuring the reflectance in the same condition as that in step S108, in other words, using light passing through the mold 30 and the imprint material 20 enables measuring information about the reflectance also including an influence of the transmittance for the light 62 of the imprint material 20. This enables further improving the overlay precision than in the first exemplary embodiment.

Moreover, the control unit 90 can perform step S204 in parallel with steps S205 and S206. Alternatively, the control unit 90 can perform step S204 in parallel with steps S102 to S105, which are performed following the measurement method.

In steps S102 to S113, the processing unit of the spread camera 210 can check the presence or absence of defects, such as tucking of particles and incomplete filling of the imprint material 20 into the mold-side pattern 30*a*, based on a result of light receiving by the image sensor of the spread camera 210. Moreover, if there are defects, such information can be stored into the storage unit 92 via the control unit 90.

Furthermore, the reflected light intensity distribution for calibration can be acquired by performing measurement on the light emitted from the light source of the spread camera 210. Moreover, the reflected light intensity distribution for calibration can be a reflected light intensity distribution obtained by performing irradiation based on the temporary irradiation amount distribution data, instead of performing irradiation with uniform illuminance light, in step S203.

Figure 8:
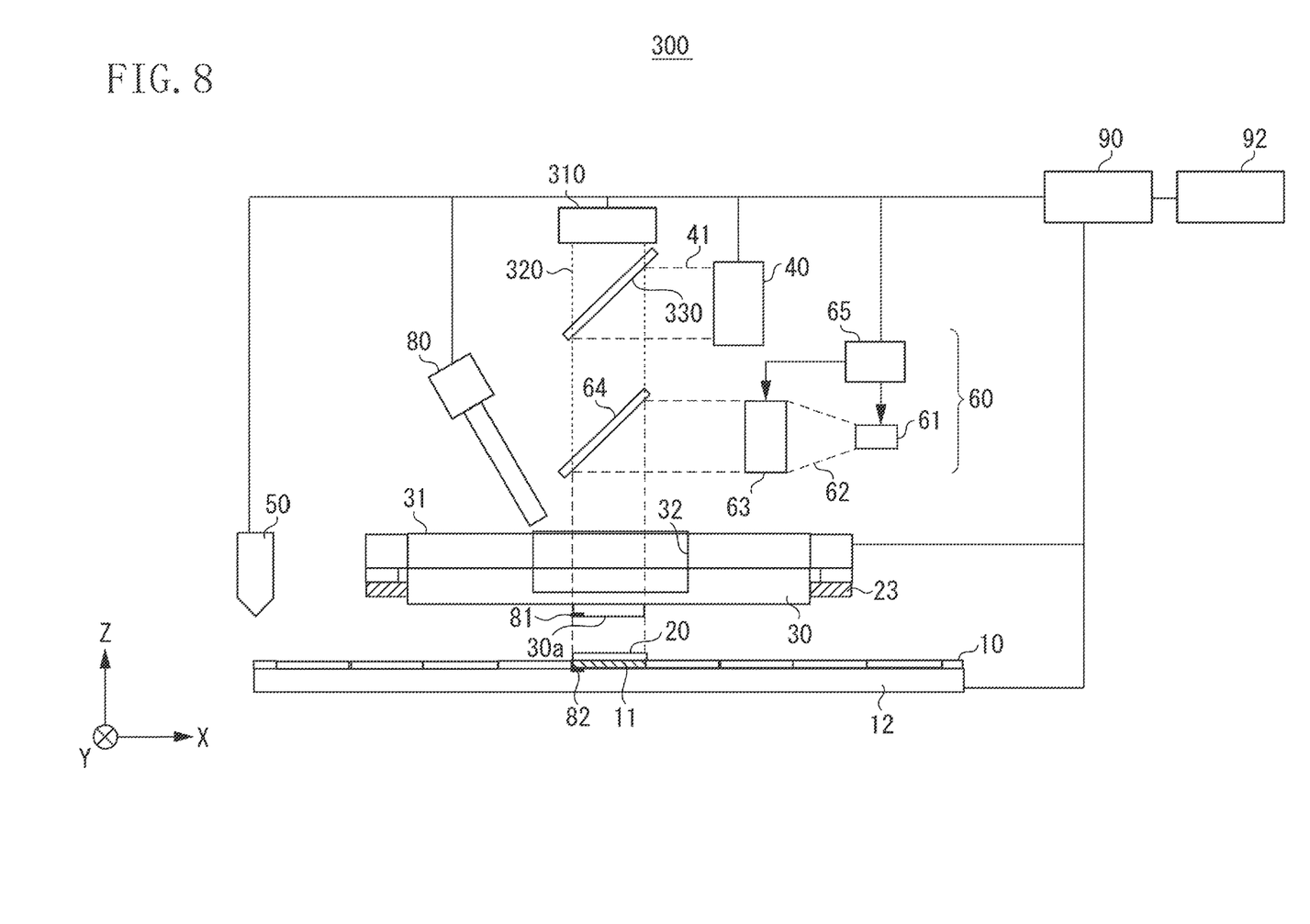
FIG. 8 illustrates a configuration of an imprint apparatus according to a fifth exemplary embodiment.

FIG. 8 illustrates a configuration of an imprint apparatus 300 according to a fifth exemplary embodiment, and a unit that acquires information about the absorption of the light 62 by the region to be processed 11 is an infrared camera 310. Moreover, the information about the absorption of the light 62 is infrared light (radiated light) from the region to be processed 11.

The infrared camera 310 includes a detector that detects infrared light, an optical system, and a processing unit that processes a result of detection, all of which are not illustrated. The detector of the infrared camera 310 is an infrared sensor in which a plurality of elements having sensitivity to infrared light is two-dimensionally arranged. The optical system of the infrared camera 310 is an imaging optical system that makes the substrate 10 and the detector optically conjugate with each other. The infrared camera 310 detects infrared light (radiated light) radiated from the region to be processed 11 heated by the heating mechanism 60. The processing unit of the infrared camera 310 detects a temperature distribution based on a result of detection by the detector or calculates a correction coefficient for the temporary irradiation amount distribution data.

A mirror 330 reflects the ultraviolet light 41 and transmits light 320. As the mirror 330, for example, a dichroic mirror is used.

In the imprint apparatus 300, the same members as those of the imprint apparatus 100 are assigned the respective same reference numerals. The detailed description of constituent members similar to those of the imprint apparatus 100 is omitted.

Figure 9:
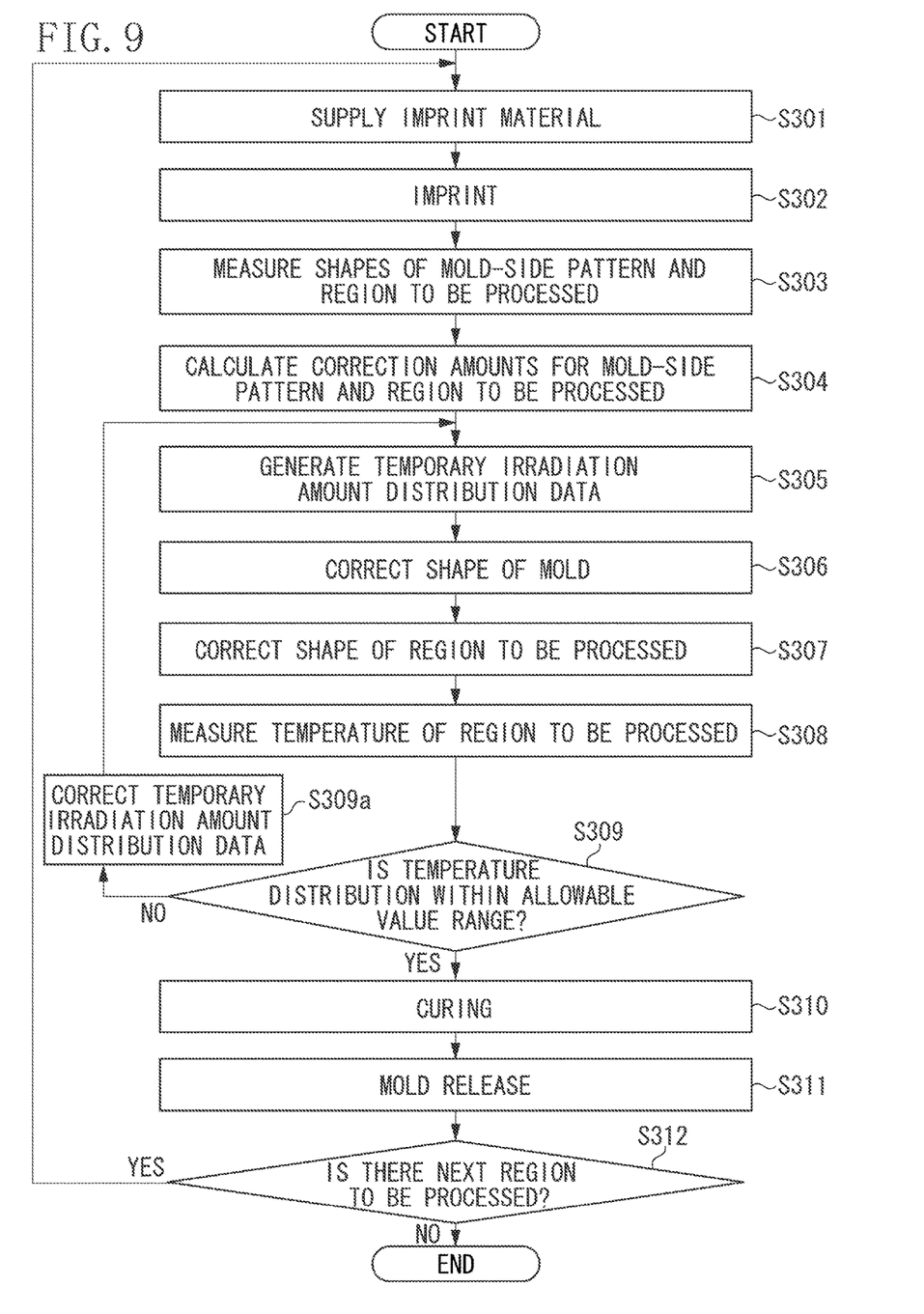
FIG. 9 is a flowchart illustrating an imprint method according to the fifth exemplary embodiment.

FIG. 9 is a flowchart illustrating an imprint method according to the fifth exemplary embodiment. The constituent members perform the following operations based on instructions issued by the control unit 90 according to a program illustrated in the flowchart of FIG. 9.

In step S301, the supply unit 50 supplies the imprint material 20 onto the region to be processed 11. In step S302, the mold stage 31 causes the mold 30 to descend, thus bring the mold 30 into contact with the imprint material 20, as an imprint operation.

Then, in step S303, the observation unit 80 measures the shape of the region to be processed 11 by observing the mark 81 and the mark 82. In step S304, the control unit 90 calculates a shape correction amount that is used for the mold-side pattern 30a by the deformation mechanism 23 and a shape correction amount that is used for the region to be processed 11 by the heating mechanism 60 based on the shape difference between the mold-side pattern 30a and the region to be processed 11.

In step S305, the control unit 90 generates temporary irradiation amount distribution data, which indicates heat amounts to be applied by the heating mechanism 60, using the shape correction amount for the region to be processed 11 calculated in step S304 and information about, for example, the design absorption factor and thermal expansion coefficient of the material of the region to be processed 11. Moreover, the control unit 90 calculates a temperature distribution obtained when the region to be processed 11 is irradiated with the light 62 based on the temporary irradiation amount distribution data, and stores the calculated temperature distribution into the storage unit 92 in association with the temporary irradiation amount distribution.

In step S306, the deformation mechanism 23 applies external force to the mold 30 based on the shape correction amount for the mold 30 obtained in step S304, thus correcting the shape of the mold 30 into an intended shape.

In step S307, the heating mechanism 60 irradiates the region to be processed 11 with the light 62 based on the temporary irradiation amount distribution data obtained in step S305, thus correcting the shape of the region to be processed 11.

In step S308, the infrared camera 310 measures infrared light radiated from the region to be processed 11 as the temperature of the region to be processed 11 is raised in step S307.

In step S309, the control unit 90 determines whether the temperature distribution of the region to be processed 11 measured in step S308 has become an intended temperature distribution based on the relationship between the temporary irradiation amount distribution data and the temperature distribution (an emissivity distribution) stored in the storage unit 92 in step S305. If the control unit 90 determines that the measured temperature distribution has not become the intended temperature distribution (NO in step S309), then in step S309a, the control unit 90 corrects the temporary irradiation amount distribution data with the emissivity used as a correction coefficient, and then returns to step S305, in which the control unit 90 generates irradiation amount distribution data in such a way that the measured temperature distribution becomes the intended temperature distribution. The deformation mechanism 23, the heating mechanism 60, and the infrared camera 310 repeat steps S305 to S309 until it is determined in step S309 that the measured temperature distribution has become the intended temperature distribution (YES in step S309). If, in step S309, the control unit 90 determines that the measured temperature distribution has become the intended temperature distribution (YES in step S309), the processing proceeds to step S310.

In step S310, the irradiation unit 40 irradiates the substrate 10 with the ultraviolet light 41, thus curing the imprint material 20. In step S311, after completion of curing, the mold stage 31 causes the mold 30 to ascend, thus separating the mold 30 from the imprint material 20, as a mold release operation. This causes a pattern of the imprint material 20 having a three-dimensional shape corresponding to the raised and recessed portions of the mold-side pattern 30a to be formed on the surface of the region to be processed 11.

In step S312, the control unit 90 determines whether there is a next region to be processed 11 on which a pattern is to be formed, and, when determining that there is no next region to be processed 11 (NO in step S312), ends the present program and performs processing for discharging the substrate 10. When, in step S312, determining that there is a next region to be processed 11 (YES in step S312), the control unit 90 repeats steps S301 to S312.

Correcting the temporary irradiation amount distribution data using a result obtained by the infrared camera 310 receiving infrared light radiated from the region to be processed 11 enables precisely correcting the shape of the region to be processed 11 regardless of a material layer stacked on the substrate 10 or a pattern previously formed on the material layer. This also enables improving the overlay precision in the region to be processed 11 on which a pattern is formed.

Furthermore, in the above-described step S309a, the control unit 90 can calculate a ratio between the intended temperature distribution and the temperature distribution measured in step S308, and can multiply the irradiation amount distribution by the calculated ratio as a coefficient. Moreover, a database in which temperature distributions and irradiation amount distributions are previously stored in association with each other based on experiments or simulations can be prepared in advance, and such an irradiation amount distribution as to obtain an intended temperature distribution can be selected.

Furthermore, while, in the fifth exemplary embodiment, the infrared camera 310 mounted in the imprint apparatus 300 measures a temperature distribution, the temperature distribution can be measured outside the imprint apparatus 300. For example, an infrared camera can measure a temperature distribution by detecting infrared light obtained when the substrate 10 is irradiated with light having a known irradiation amount distribution using a light source having the same wavelength as that of the heating mechanism 60. Moreover, while, in step S309 in the fifth exemplary embodiment, control is performed to give feedback to the irradiation amount distribution with an intended temperature distribution of the region to be processed 11 used as a determination criterion, open control can be employed. Additionally, a shape difference or relative positional deviation between the mold-side pattern 30a and the region to be processed 11 obtained based on a result of observation by the observation unit 80 can be used as the determination criterion. For example, the measurement of a shape difference between the mold-side pattern 30a and the region to be processed 11 in step S303 and the calculation of correction amounts for the mold 30 and the region to be processed 11 in step S304 can be continuously performed during steps S305 to S309, and the temporary irradiation amount distribution data generated in step S305 can be updated as appropriate. Then, results of correction of the mold-side pattern 30a and the region to be processed 11 in steps S306 and S307 are measured by the observation unit 80, and a correction coefficient is calculated in such a way as to minimize a correction residual by, for example, a least-square method. Then, an irradiation amount distribution is calculated based on the calculated correction coefficient.

Furthermore, instead of determining a correction coefficient based on a temperature distribution, the imprint apparatus 300 can convert the temperature distribution into an absorption factor distribution for light of the region to be processed 11 and can use the absorption factor distribution to determine a correction coefficient for correcting the temporary irradiation amount distribution data.

In a sixth exemplary embodiment, the control unit converts a representative reflectance obtained by measurement using the measurement unit 70 or the spread camera 210 into an absorption factor for the light 62, thus generating temporary irradiation amount distribution data. Measuring information about the absorption of the light 62 by the region to be processed 11 enables generating temporary irradiation amount distribution data for precisely correcting the shape of the region to be processed 11, as compared with the case of using an absorption factor predicted in the design. In a case where the shape of the region to be processed 11 can be precisely corrected based on temporary irradiation amount distribution data, imprint processing can be performed with the temporary irradiation amount distribution data directly used as irradiation amount distribution data. As with the first to fifth exemplary embodiments, the control unit 90 can use irradiation amount distribution data obtained by correcting the temporary irradiation amount distribution data. This enables reducing at least one of the variation of an absorption factor for the light 62 for each lot of the substrate 10, the variation of an absorption factor for the light 62 within the surface of the same substrate 10, and the variation of an absorption factor for the light 62 for each chip region.

In the first to fifth exemplary embodiments, the measurement of the shapes of the mold-side pattern and the region to be processed and the calculation of shape correction amounts for the mold-side pattern and the region to be processed can be performed after the imprint operation.

In the substrate 10, a film having a high absorption factor intended for planarization can be formed as a layer located directly beneath a layer of the imprint material 20.

In the first to third exemplary embodiments and the fifth exemplary embodiment, a spread camera can be mounted for the purpose of detecting particles or detecting a defect of incomplete filling of the imprint material 20.

A correction value for correcting a temporary irradiation amount distribution determined based on the shape of the region to be processed 11 is not necessarily a value by which to multiply the temporary irradiation amount distribution. The correction value can be a value to be used when arithmetic processing is performed on the temporary irradiation amount distribution. Moreover, the correction value can be an average value of correction values at a plurality of points.

In the imprint method according to the first to third exemplary embodiments, the measurement unit 70 can be located outside the imprint apparatus 100. For example, a reflectance measurement device (not illustrated) located outside the imprint apparatus 100 can be used to measure the reflectance of the region to be processed 11 prior to carrying-in of the substrate 10. In a case where the reflectance is measured outside the imprint apparatus 100, a result of measurement is stored into the storage unit 92 via a wired or wireless line or via an input operation by the user. The control unit 90 acquires the reflectance from the storage unit 92. The control unit 90 can directly acquire the reflectance from the measurement unit 70.

In the imprint method according to an exemplary embodiment, an apparatus having the function serving as a generation unit that generates irradiation amount distribution data, among the functions of the control unit 90, can be located outside the imprint apparatus 100. The irradiation amount distribution generated by the control unit 90 can be sent to the storage unit 92 via a storage information medium or via wired or wireless communication. The functions included in the control unit 90 can be provided on a single control circuit board or on separate control circuit boards as long as the respective functions are provided.

The shape of the mold-side pattern 30a and the shape of the region to be processed 11 can be results of measurements previously performed before the imprint processing illustrated in the flowchart of FIG. 4. In this case, step S103 is changed to a step of reading out the results of previous measurements from the storage unit 92.

Only shape correction by thermal deformation for the region to be processed 11 can be performed without performing shape correction for the mold 30.

A control circuit board for effecting the function serving as the calculation unit 76 included in the measurement unit 70 can be located on the same control circuit board as a control circuit board constituting the control unit 90.

As the imprint material 20, a curable composition, which cures by receiving curing energy, is used. The curing energy to be used includes, for example, electromagnetic wave, radiation, and heat. Electromagnetic wave is, for example, light, such as infrared light, visible light, and ultraviolet light, selected from ones having wavelengths in the range of 10 nm or more and 1 mm or less.

The curable composition is a composition which cures by irradiation with light or radiation or by heating. Of these compositions, a photo-curable composition, which cures by light, contains at least a polymerizable compound and a photopolymerization initiator, and can contain a non-polymerizable compound or a solvent as needed. The non-polymerizable compound is at least one compound selected from the group consisting of, for example, sensitizer, hydrogen donor, internal additive mold release agent, surfactant agent, antioxidizing agent, and polymer component.

The imprint material is applied by a spin coater or a slit coater onto the substrate in a film manner. Alternatively, the imprint material can be applied by a liquid ejection head onto the substrate in a droplet manner or in an island-shaped manner or film-shaped manner in which a plurality of droplets is connected. The viscosity (the viscosity at 25° C.) of the imprint material is, for example, 1 millipascal-second (mPa·s) or more and 100 mPa·s or less.

[Application to Manufacturing of an Article]

The pattern of a cured product formed by using the imprint apparatus 100 is permanently used for at least a part of various articles, or is temporarily used for manufacturing various articles.

Examples of the article include an electrical circuit element, an optical element, a microelectromechanical system (MEMS), a recording element, a sensor, and a mold. Examples of the electrical circuit element include a volatile or non-volatile semiconductor memory, such as a dynamic RAM (DRAM), a static RAM (SRAM), a flash memory, and a magnetoresistive RAM (MRAM), and a semiconductor element, such as a large-scale integration (LSI) circuit, a charge-coupled device (CCD), an image sensor, and a Field Programmable Gate Array (FPGA). Examples of the mold include a mold for imprinting. The pattern of a cured product is directly used as at least a part of constituent members of the above-mentioned article, or is temporarily used as a resist mask.

In the case of temporarily using the pattern of a cured product, after, for example, etching or ion implantation is performed in the process of processing the substrate 10, the resist mask is removed. Moreover, other known processing processes (for example, development, oxidation, film formation, vapor deposition, planarization, peeling of an imprint material, dicing, bonding, and packaging) can be applied.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-229179, filed Nov. 24, 2015, and No. 2016-197284, filed Oct. 5, 2016, which are hereby incorporated by reference herein in its entirety.

What is claimed is:

1. An imprint apparatus for forming a pattern of an imprint material on a substrate using a mold, the imprint apparatus comprising:
   a heating unit configured to irradiate a region to be processed on the substrate with light to heat the region to be processed;
   a generation unit configured to generate irradiation amount distribution data, which indicates an irradiation amount distribution of light with which the heating unit irradiates the region to be processed; and
   a measurement unit configured to measure information about absorption of the light by the region to be processed,
   wherein the generation unit is configured to generate the irradiation amount distribution data by correcting, using a result of measurement by the measurement unit, temporary irradiation amount distribution data temporarily generated based on a shape of the region to be processed taken before the region to be processed is heated by the heating unit.

2. The imprint apparatus according to claim 1, wherein the measurement unit measures the information by receiving reflected light of the light reflected at the region to be processed.

3. The imprint apparatus according to claim 2, wherein the measurement unit measures the reflected light having passed through the mold.

4. The imprint apparatus according to claim 2, wherein a wavelength band of light which the measurement unit uses for measurement contains wavelengths of the light which the heating unit uses for heating.

5. The imprint apparatus according to claim 1, wherein the measurement unit measures the information by receiving radiated light from the region to be processed that is generated by irradiation of the region to be processed with the light.

6. The imprint apparatus according to claim 1, wherein the generation unit generates the irradiation amount distribution data by performing arithmetic processing including a calculation for multiplying the temporary irradiation amount distribution data by a correction value determined based on the result of measurement by the measurement unit.

7. The imprint apparatus according to claim 6,
   wherein the light which the heating unit uses for heating is heating light, and
   wherein the correction value is a ratio of (i) an absorption factor for the heating light of the region to be processed used for generation of the temporary irradiation amount distribution data to (ii) an absorption factor for the heating light of the region to be processed determined based on a reflectance measured by the measurement unit.

8. The imprint apparatus according to claim 1,
   wherein the region to be processed includes a plurality of regions to be processed on the substrate,
   wherein the measurement unit measures respective reflectances of the plurality of regions to be processed by receiving respective light beams reflected at the plurality of regions to be processed, and
   wherein the generation unit generates the irradiation amount distribution data based on respective results of measurement by the measurement unit at the plurality of regions to be processed.

9. The imprint apparatus according to claim 1,
   wherein the region to be processed includes a plurality of chip regions,
   wherein the measurement unit receives light beams reflected at a plurality of locations in one of the chip regions to measure respective reflectances at the plurality of locations, and
   wherein the generation unit generates the irradiation amount distribution data based on respective results of measurement by the measurement unit at the chip region.

10. The imprint apparatus according to claim 1, wherein the irradiation amount distribution data is irradiation amount distribution data for reducing a shape difference between a pattern region of the mold and the region to be processed.

11. An imprint apparatus for forming a pattern of an imprint material on a substrate using a mold, the imprint apparatus comprising:
   a heating unit configured to irradiate a region to be processed on the substrate with light to heat the region to be processed; and
   a generation unit configured to generate irradiation amount distribution data, which indicates an irradiation amount distribution of light with which the heating unit is to irradiate the region to be processed,
   wherein the generation unit is configured to generate the irradiation amount distribution data by correcting, using information about absorption of the light by the region to be processed, temporary irradiation amount distribution data temporarily generated based on a shape of the region to be processed taken before the region to be processed is heated by the heating unit.

* * * * *